(12) United States Patent
Lee et al.

(10) Patent No.: US 11,558,959 B2
(45) Date of Patent: Jan. 17, 2023

(54) PRINTED CIRCUIT BOARD

(71) Applicant: SAMSUNG ELECTRO-MECHANICS CO., LTD., Suwon-si (KR)

(72) Inventors: Jin Uk Lee, Suwon-si (KR); Sangik Cho, Suwon-si (KR); Eun Sun Kim, Suwon-si (KR); Young Hun You, Suwon-si (KR); Jong Eun Park, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/230,437

(22) Filed: Apr. 14, 2021

(65) Prior Publication Data

US 2022/0217843 A1    Jul. 7, 2022

(30) Foreign Application Priority Data

Jan. 4, 2021 (KR) .......................... 10-2021-0000326

(51) Int. Cl.
| | |
|---|---|
| H05K 1/09 | (2006.01) |
| H05K 1/11 | (2006.01) |
| H05K 3/20 | (2006.01) |
| H05K 3/18 | (2006.01) |
| H05K 3/24 | (2006.01) |

(52) U.S. Cl.
CPC ............. *H05K 1/11* (2013.01); *H05K 1/09* (2013.01); *H05K 3/205* (2013.01); *H05K 3/184* (2013.01); *H05K 3/244* (2013.01); *H05K 2201/032* (2013.01); *H05K 2201/0347* (2013.01); *H05K 2201/0379* (2013.01); *H05K 2201/0391* (2013.01); *H05K 2201/099* (2013.01); *H05K 2203/072* (2013.01); *H05K 2203/0723* (2013.01)

(58) Field of Classification Search
CPC ............................... H05K 1/09; H05K 1/0242
See application file for complete search history.

(56) References Cited

U.S. PATENT DOCUMENTS

2013/0153271 A1* 6/2013 Ogawa ................. H05K 1/0313
174/262
2017/0194240 A1    7/2017 Park et al.

FOREIGN PATENT DOCUMENTS

KR    10-2017-0081948 A    7/2017
KR    10-2018-0013017 A    2/2018

* cited by examiner

*Primary Examiner* — Jeremy C Norris
(74) *Attorney, Agent, or Firm* — Morgan, Lewis & Bockius LLP (57) ABSTRACT

A printed circuit board includes an insulating layer, a circuit pattern embedded in the insulating layer and including a first metal layer, a second metal layer and a third metal layer disposed between the first metal layer and the second metal layer, and a connection conductor disposed on one surface of the insulating layer and connected to the circuit pattern, wherein the first metal layer is exposed through the one surface of the insulating layer.

16 Claims, 5 Drawing Sheets

PRINTED CIRCUIT BOARD

CROSS-REFERENCE TO RELATED APPLICATION(S)

This application claims the benefit of priority to Korean Patent Application No. 10-2021-0000326, filed on Jan. 4, 2021 in the Korean Intellectual Property Office, the disclosure of which is incorporated herein by reference in its entirety.

TECHNICAL FIELD

The present disclosure relates to a printed circuit board.

BACKGROUND

To form a circuit pattern of a printed circuit board (PCB), a circuit pattern is formed on a carrier substrate, an insulating layer covering the circuit pattern is formed, and the carrier substrate is then removed to implement a fine circuit pattern embedded in the insulating layer in some cases.

SUMMARY

Exemplary embodiments provide a printed circuit board including a fine circuit pattern.

Exemplary embodiments provide a printed circuit board capable of preventing etching of a metal layer during an etching process.

Exemplary embodiments provide a printed circuit board not requiring a separate surface treatment.

According to an aspect of the present disclosure, a printed circuit board may include: an insulating layer; a circuit pattern embedded in the insulating layer and including a first metal layer, a second metal layer, and a third metal layer disposed between the first metal layer and the second metal layer; and a connection conductor disposed on one surface of the insulating layer and connected to the circuit pattern, wherein the first metal layer is exposed through the one surface of the insulating layer.

According to another aspect of the present disclosure, a printed circuit board may include: an insulating layer; and a circuit pattern embedded in the insulating layer and including a first metal layer and a second metal layer, disposed on the first metal layer, wherein the first metal layer is exposed through one surface of the insulating layer and includes at least one of palladium or tin.

According to still another aspect of the present disclosure, a printed circuit board may include: an insulating layer; a circuit pattern embedded in the insulating layer and including a first metal layer and a second metal layer disposed on the first metal layer, the first metal layer being expose through one surface of the insulating layer; and a connection conductor disposed on one surface of the insulating layer and connected to an exposed portion of the first metal layer, wherein the first and second metal layers include different materials from each other.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or exemplary embodiment, e.g., as to what an example or exemplary embodiment may include or implement, means that at least an example or exemplary embodiment exists in which such a feature is included or implemented while all examples and exemplary embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there may be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of this application. Further, although the examples described herein have a variety of configurations, other configurations are possible as will be apparent after gaining an understanding of the disclosure of this application.

The drawings may not be to scale, and the relative size, proportions, and depiction of elements in the drawings may be exaggerated for clarity, illustration, and convenience.

Figure 1:
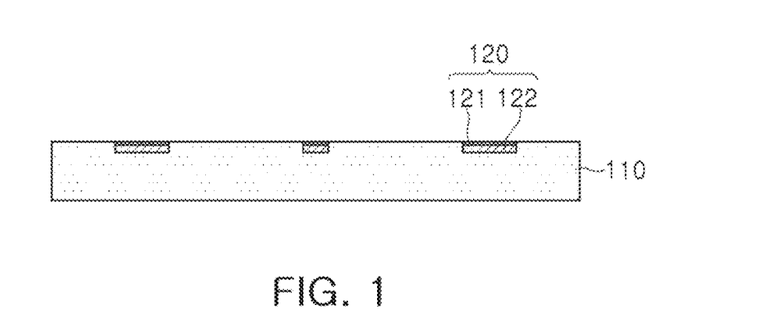
FIG. 1 is a schematic cross-sectional view of a printed circuit board according to an exemplary embodiment in the present disclosure.

FIG. 1 is a schematic cross-sectional view of a printed circuit board according to an exemplary embodiment in the present disclosure.

Referring to FIG. 1, a printed circuit board includes an insulating layer 110 and a circuit pattern 120 embedded in the insulating layer 110. Here, the circuit pattern 120 includes a first metal layer 121 and a second metal layer 122 disposed on the first metal layer 121, and the first metal layer 121 is exposed through one surface of the insulating layer 110.

A material for forming the insulating layer 110 is not particularly limited, and an insulating material used for a printed circuit board may be used. For example, as a material for forming the insulating layer 110, known materials such as prepreg (PPG), Ajinomoto build-up film (ABF), polyimide, epoxy, resin coated copper (RCC), liquid crystal polymer (LCP), etc. may be used.

The circuit pattern 120 may function as a circuit pattern. The circuit pattern 120 may be embedded such that one surface and a side surface thereof are covered with the insulating layer 110. Specifically, a side surface of the first metal layer 121 and one surface and a side surface of the second metal layer 122 may be covered with the insulating layer 110.

The circuit pattern 120 may be formed through a known plating method, e.g., an additive process (AP), a semi-additive process (SAP), a modified semi-additive process (MSAP). As another example, the circuit pattern 120 may be formed through a subtractive process such as tenting.

As a material for forming the first metal layer 121, a conductive material may be used. For example, as a material for forming the first metal layer 121, copper (Cu), aluminum (Al), silver (Ag), gold (Au), nickel (Ni), lead (Pb), titanium (Ti), tin (Sn), palladium (Pd), or alloys thereof may be used.

The first metal layer 121 may function as a seed layer when the second metal layer 122 is formed. For example, the second metal layer 122 may be formed on the first metal layer 121, a seed layer, through electroplating.

The first metal layer 121 is formed of a material different from a metal foil of a carrier substrate, and thus, when the metal foil of the carrier substrate is removed after the printed circuit board is separated from the carrier substrate, the first metal layer 121 may serve as an etching barrier layer preventing the first metal layer 121 from being etched. For example, when the metal foil of the carrier substrate is copper foil, the first metal layer 121 may be formed of a material not etched by an etching solution of the copper foil. Therefore, the first metal layer 121 is not etched when the metal foil of the carrier substrate is removed, whereby the entire thickness of the circuit pattern 120 may be maintained and the first metal layer 121 may be substantially coplanar with one surface of the insulating layer 110. One or ordinary skill in the art would understand that the expression "substantially the same" refers to being the same by allowing process errors, positional deviations, and/or measurement errors that may occur in a manufacturing process.

Figure 2:
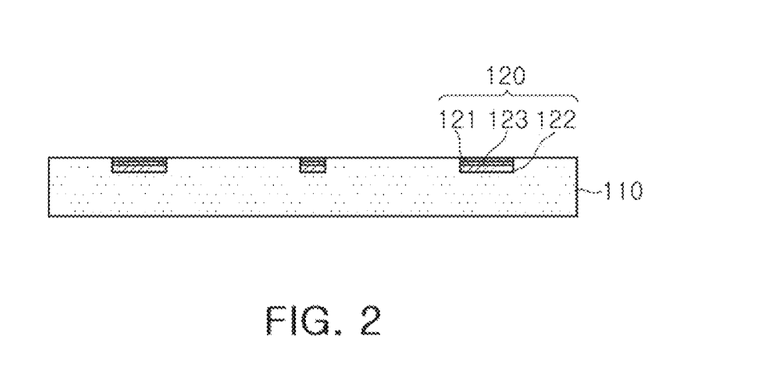
FIG. 2 is a schematic cross-sectional view of a printed circuit board according to another exemplary embodiment in the present disclosure.

In addition, the first metal layer 121 may function as a surface treatment layer of the second metal layer 122. For example, the second metal layer 122 may be a copper plating layer, and the first metal layer 121 may be a gold, silver, palladium, nickel and/or tin plating layer. Here, the first metal layer 121 may be formed of a plurality of metal layers, and for example, as shown in FIG. 2, the first metal layer 121 may further include a third metal layer. When the second metal layer 122 functions as a surface treatment layer of the first metal layer 121, an introduction of a separate surface treatment layer may not be required. In view of this, the first metal layer 121 and the second metal layer 122 may include materials different from each other. However, the present disclosure is not limited thereto, and the second metal layer 122 may include the same material as that of the first metal layer 121.

As a method of forming the first metal layer 121, a known plating method may be used. For example, the first metal layer 121 may be formed using electroless plating such as displacement plating (or immersion plating) or reduction plating. In particular, when the first metal layer 121 is formed through displacement plating, the first metal layer 121 may be easily formed, only through immersion, thereby simplifying the process. In view of this, the first metal layer 121 may include at least one of palladium or tin, and through this, the first metal layer 121 having a fine pitch may be easily formed through the aforementioned displacement plating.

A thickness of the first metal layer 121 is not particularly limited, but may be smaller than a thickness of the second metal layer 122. For example, the first metal layer 121 may have a thickness of 1 μm or less.

In one example, a thickness of an element may mean a dimension of the element in a direction perpendicular to a planar surface of the element. The thickness of the element may be any one of an average thickness, a maximum thickness, a minimum thickness, or a thickness of the element measured in a predetermined region, unless contradictory to another definition explicitly described. In one example, the thickness of the element may be determined by defining a predetermined number (e.g., 5) of points to the left and the predetermined number (e.g., 5) of points to the right from a reference center point of the element at equal intervals (or non-equal intervals, alternatively), measuring a thickness of each of the points at equal intervals (or non-equal intervals, alternatively), and obtaining an average value therefrom. Alternatively, the thickness may be the maximum thickness or the minimum thickness of the multiple measurements. Alternatively, the thickness may be a thickness of the reference center point in the measured region. In one example, an optical microscope or a scanning electron microscope (SEM) may be used in the measurement, although the present disclosure is not limited thereto. Other measurement methods and/or tools appreciated by one of ordinary skill in the art, even if not described in the present disclosure, may also be used.

Meanwhile, the first metal layer 121 may be removed according to the needs of those skilled in the art. Accordingly, the circuit pattern 120 of the printed circuit board may only include the second metal layer 122.

A conductive material may also be used as a material for forming the second metal layer 122. For example, as a material for forming the second metal layer 122, a conductive material such as copper (Cu), aluminum (Al), silver (Ag), gold (Au), nickel (Ni), lead (Pb), titanium (Ti), tin (Sn), palladium (Pd), or alloys thereof may be used. Meanwhile, as described above, the second metal layer 122 and the first metal layer 121 may include different materials.

A method of forming the second metal layer 122 may be a known plating method such as electrolytic plating. As described above, the first metal layer 121 may function as a seed layer when the second metal layer 122 is formed.

FIG. 2 is a schematic cross-sectional view of a printed circuit board according to another exemplary embodiment in the present disclosure.

Referring to FIG. 2, a printed circuit board according to another example includes an insulating layer 110 and a circuit pattern 120 embedded in the insulating layer 110. Here, the circuit pattern 120 includes a first metal layer 121, a second metal layer 122, and a third metal layer 123 disposed between the first metal layer 121 and the second metal layer 122, and the first metal layer 121 is exposed through one surface of the insulating layer 110. That is, the configuration of the circuit pattern 120 of the printed circuit board according to another example is different from that of the printed circuit board according to the example of FIG. 3. Specifically, the circuit pattern 120 further includes a third metal layer 123 disposed between the first metal layer 121 and the second metal layer 122 and having a side surface covered with the insulating layer 110.

A conductive material may also be used as a material for forming the third metal layer 123. For example, as a material for forming the second metal layer 122, a conductive material such as copper (Cu), aluminum (Al), silver (Ag), gold (Au), nickel (Ni), lead (Pb), titanium (Ti), tin (Sn), palladium (Pd), or alloys thereof may be used.

The third metal layer 123 may function to block alloying of the first metal layer 121 and the second metal layer 122. In particular, in a case in which the first metal layer 121 and the second metal layer 122 form an intermetallic compound (IMC), the third metal layer 123 may be introduced to prevent alloying.

At least two of the first metal layer 121, the second metal layer 122, and the third metal layer 123 may include different materials. For example, the first metal layer 121 may include silver, the second metal layer 122 may include at least one of nickel, palladium, or a nickel-palladium alloy, and the third metal layer 123 may include copper, but the present disclosure is not limited thereto.

A thickness of the second metal layer 122 may be greater than a thickness of the first metal layer 121 and a thickness of the third metal layer 123, respectively.

Figure 7:
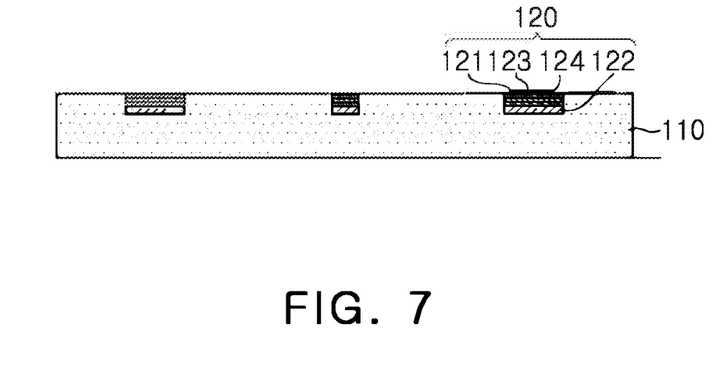
FIG. 7 is a schematic cross-sectional view of a printed circuit board according to another exemplary embodiment in the present disclosure.

Referring to FIG. 7, the circuit pattern 120 of the printed circuit board according to another example may further include a fourth metal layer 124 between the second metal layer 122 and the third metal layer 123. For example, the first metal layer 121, the third metal layer 123, the fourth metal layer 124, and the second metal layer 122 may be sequentially disposed to form a circuit pattern 120 including four metal layers.

A conductive material may also be used as a material for forming the fourth metal layer. For example, as a material for forming the fourth metal layer, a conductive material such as copper (Cu), aluminum (Al), silver (Ag), gold (Au), nickel (Ni), lead (Pb), titanium (Ti), tin (Sn), palladium (Pd), or alloys thereof may be used. Meanwhile, the second metal layer 122 and the fourth metal layer may include different materials.

Figure 3:
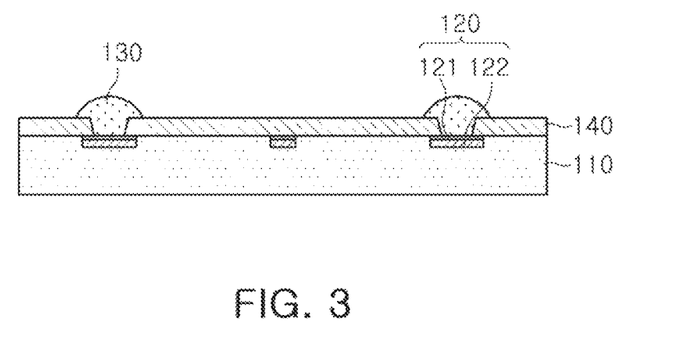
FIG. 3 is a schematic cross-sectional view in which a connection conductor is disposed on the printed circuit board of FIG. 1.

FIG. 3 is a schematic cross-sectional view in which a connection conductor is disposed on the printed circuit board of FIG. 1.

The connection conductor 130 may be disposed on one surface of the insulating layer 110 and connected to the circuit pattern 120. Here, the connection conductor 130 may be in contact with the first metal layer 121 so as to be connected to the circuit pattern 120.

The connection conductor 130 may be a solder ball, but is not limited thereto, and a conductive material may be used without a limitation.

A protective layer 140 may have an opening exposing at least a portion of the circuit pattern 120, and at least a portion of the connection conductor 130 may be disposed in the opening. Here, the opening may expose at least a portion of the first metal layer 121.

The protective layer 140 may be a solder resist. However, the protective layer 140 may also be formed of another insulating material such as ABF or photosensitive resin.

Figure 4:
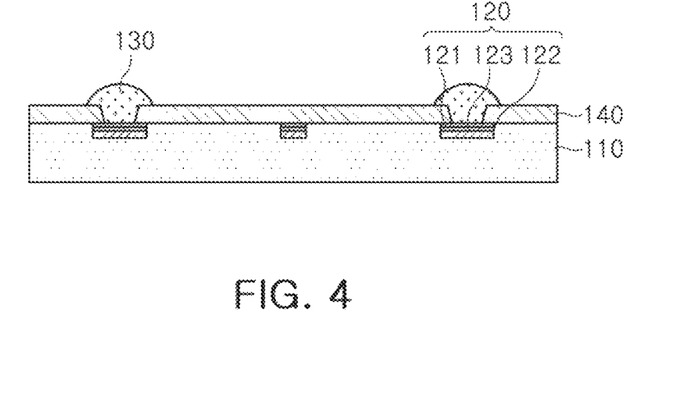
FIG. 4 is a schematic cross-sectional view in which a connection conductor is disposed on the printed circuit board of FIG. 2.

FIG. 4 is a schematic cross-sectional view in which a connection conductor is disposed on the printed circuit board of FIG. 2.

Substantially the same descriptions as those of FIG. 3 may be applied to the connection conductor 130 and the protective layer 140, and thus, a detailed description thereof will be omitted.

In one exemplary embodiment, the connection conductor 130 may protrude from one surface of the protective layer 140 opposing the one surface of the insulating layer 110, and further extend onto a portion of the one surface of the protective layer 140.

FIGS. 5A through 5G schematically illustrate a manufacturing process of the printed circuit board of FIG. 1.

Figure 5A:
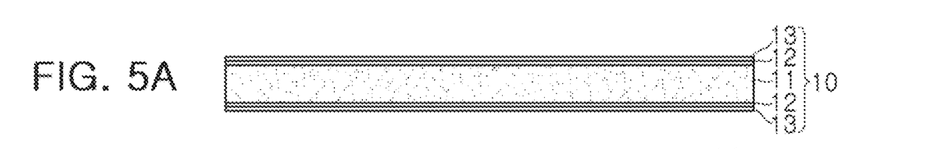
FIGS. 5A through 5G schematically illustrate a manufacturing process of the printed circuit board of FIG. 1.

Referring to FIG. 5A, a carrier substrate 10 in which a first metal foil 12 and a second metal foil 13 are stacked on at least one surface of an insulating substrate 11 is prepared. The second metal foil 13 may be a copper foil, but is not limited thereto. In addition, a release layer may be additionally disposed between the first metal foil 12 and the second metal foil 13.

Figure 5B:
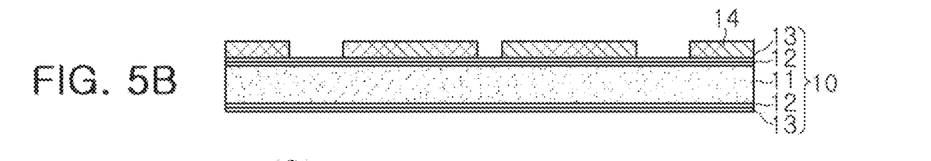

Next, referring to FIG. 5B, a resist 14 having an opening is disposed on the second metal foil 13. Here, it is illustrated that the resist 14 is disposed only on the first metal foil 12 disposed on one side of the insulating substrate 11, but the resist 14 may be disposed on each of the first metal foils 12 disposed on both sides of the insulating substrate 11.

Figure 5C:
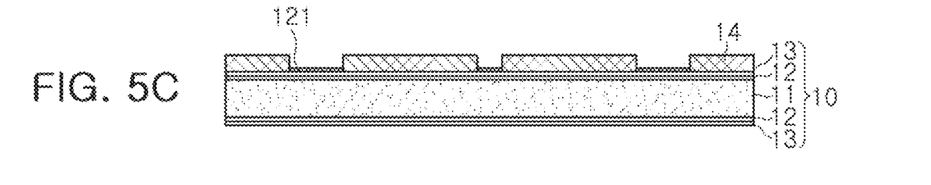

Next, referring to FIG. 5C, a first metal layer 121 is formed in the opening of the resist 14. The first metal layer 121 may be formed through electroless plating, electroplating, or the like.

Figure 5D:
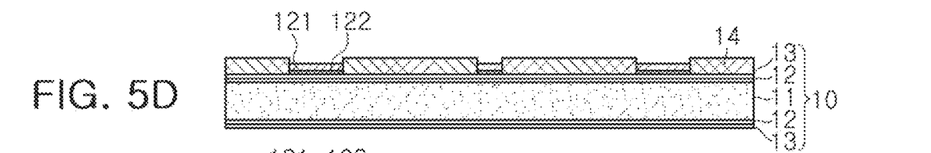

Next, referring to FIG. 5D, a second metal layer 122 is formed on the first metal layer 121. The second metal layer 122 may be formed by electroplating, but is not limited thereto.

Figure 5E:
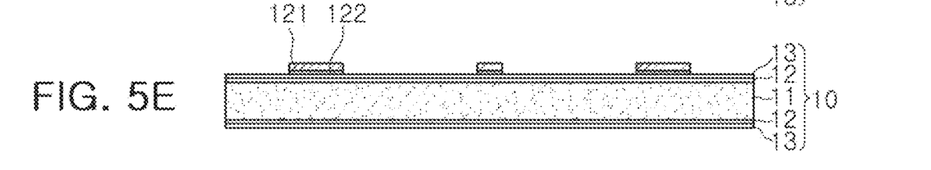

Next, referring to FIG. 5E, the resist 14 is removed. Here, the resist 14 may be removed by peeling or the like.

Figure 5F:
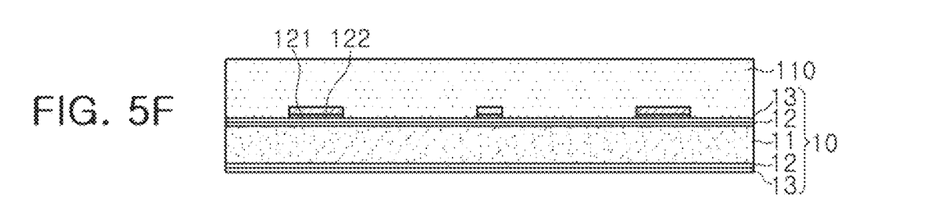

Next, referring to FIG. 5F, an insulating layer 110 is formed. The insulating layer 110 may be formed by a method of lamination or the like, and here, an insulating material constituting the insulating layer 110 may be stacked in an uncured or semi-cured (B-stage) state.

Figure 5G:
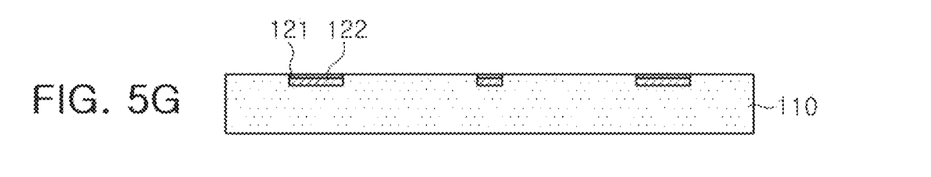

Next, referring to FIG. 5G, the carrier substrate 10 is removed. Specifically, the first metal foil 12 and the second metal foil 13 of the carrier substrate 10 are separated, and the second metal foil 13 attached to the insulating layer 110 may then be removed by etching.

Here, by forming the first metal layer 121 with a material different from the second metal foil 13, the first metal foil 121 may not be etched together when the second metal foil 13 is removed. Through this, since the first metal layer 121 is not etched, the entire thickness of the circuit pattern 120 may be maintained and the first metal layer 121 may be substantially coplanar with one surface of the insulating layer 110.

In addition, the first metal layer 121 may be formed of a material different from the second metal layer 122. Specifically, the first metal layer 121 may be formed of a material having extremely low reactivity, and thus a separate surface treatment layer may not be introduced on the surface of the circuit pattern 120.

FIGS. 6A through 6G schematically illustrate a manufacturing process of the printed circuit board of FIG. 2.

Figure 6A:
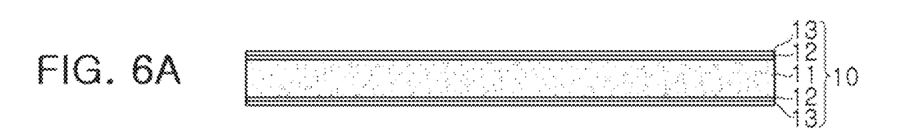
FIGS. 6A through 6G schematically illustrate a manufacturing process of the printed circuit board of FIG. 2.
Figure 6B:
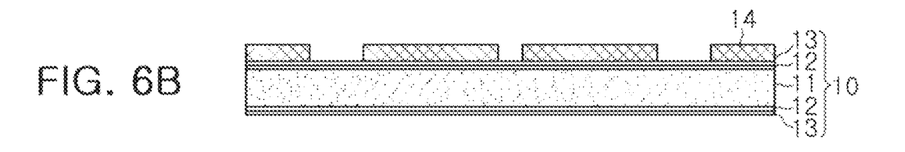
Figure 6C:
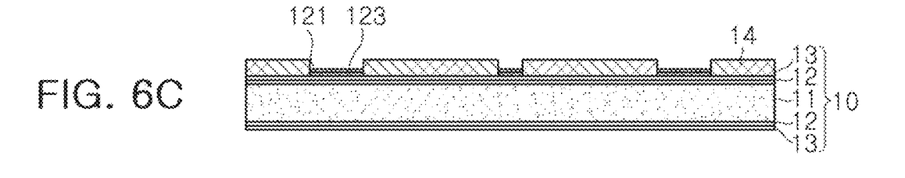
Figure 6D:
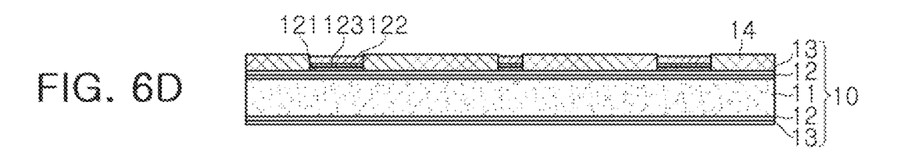
Figure 6E:
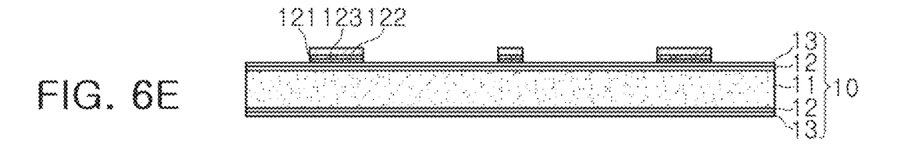
Figure 6F:
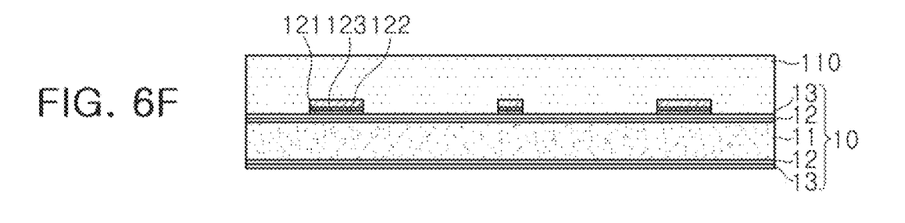
Figure 6G:
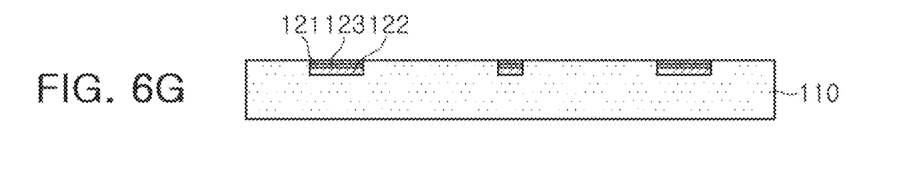

Referring to FIG. 6C, the first metal layer 121 and the third metal layer 123 are sequentially formed in an opening of a resist 14. Each of the first and third metal layers 121 and 123 may be formed through electroless plating or electroplating.

Substantially the same descriptions as those described above with reference to FIGS. 5A through 5G may be applied, and thus, a detailed description thereof will be omitted.

As set forth above, as one of the various effects of the present disclosure, a printed circuit board including a fine circuit pattern may be provided.

As another of the various effects of the present disclosure, a printed circuit board capable of preventing etching of a metal layer during an etching process may be provided.

As another of the various effects of the present disclosure, a printed circuit board not requiring a separate surface treatment may be provided.

While example exemplary embodiments have been shown and described above, it will be apparent to those skilled in the art that modifications and variations could be made without departing from the scope of the present disclosure as defined by the appended claims.

What is claimed is:

1. A printed circuit board comprising:
    an insulating layer;
    a circuit pattern embedded in the insulating layer and including a first metal layer, a second metal layer, a third metal layer disposed between the first metal layer and the second metal layer, and a fourth metal layer disposed between the second metal layer and the third metal layer; and
    a connection conductor disposed on one surface of the insulating layer and connected to the circuit pattern,
    wherein the first metal layer is exposed through the one surface of the insulating layer and includes at least one of palladium or tin.

2. The printed circuit board of claim 1, wherein the first metal layer is substantially coplanar with the one surface of the insulating layer.

3. The printed circuit board of claim 1, wherein the first metal layer includes at least one of gold, silver, palladium, nickel, or tin.

4. The printed circuit board of claim 1, wherein at least two of the first metal layer, the second metal layer, and the third metal layer include different materials from each other.

5. The printed circuit board of claim 1, wherein a side surface of each of the first metal layer, the second metal layer, and the third metal layer is covered with the insulating layer.

6. The printed circuit board of claim 1, wherein a thickness of the second metal layer is greater than each of a thickness of the first metal layer and a thickness of the third metal layer.

7. The printed circuit board of claim 1, wherein the connection conductor is in contact with the first metal layer.

8. The printed circuit board of claim 1, further comprising:
    a protective layer disposed on the insulating layer and having an opening exposing at least a portion of the circuit pattern,
    wherein at least a portion of the connection conductor is disposed in the opening.

9. A printed circuit board comprising:
    an insulating layer; and
    a circuit pattern embedded in the insulating layer and including a first metal layer, a second metal layer disposed on the first metal layer, a third metal layer disposed between the first metal layer and the second metal layer, and a fourth metal layer disposed between the second metal layer and the third metal layer,
    wherein the first metal layer is exposed through one surface of the insulating layer and includes at least one of palladium or tin.

10. The printed circuit board of claim 9, wherein the second metal layer includes a material different from a material of the first metal layer.

11. A printed circuit board comprising:
    an insulating layer;
    a circuit pattern embedded in the insulating layer and including a first metal layer and a second metal layer disposed on the first metal layer, a third metal layer disposed between the first metal layer and the second metal layer, and a fourth metal layer disposed between the second metal layer and the third metal layer, the first metal layer being exposed through one surface of the insulating layer;

a connection conductor disposed on the one surface of the insulating layer and connected to an exposed portion of the first metal layer; and a protective layer disposed on the insulating layer and having an opening exposing at least a portion of the circuit pattern, wherein the first and second metal layers include different materials from each other, at least a portion of the connection conductor is disposed in the opening, and the connection conductor protrudes from one surface of the protective layer opposing the one surface of the insulating layer, and further extends onto a portion of the one surface of the protective layer.

12. The printed circuit board of claim 11, wherein the first metal layer is substantially coplanar with the one surface of the insulating layer.

13. The printed circuit board of claim 11, wherein the first metal layer includes at least one of gold, silver, palladium, nickel, or tin.

14. The printed circuit board of claim 11, wherein at least two of the first metal layer, the second metal layer, and the third metal layer include different materials from each other.

15. The printed circuit board of claim 11, wherein a side surface of each of the first metal layer, the second metal layer, and the third metal layer is covered with the insulating layer.

16. The printed circuit board of claim 11, wherein a thickness of the second metal layer is greater than each of a thickness of the first metal layer and a thickness of the third metal layer.

* * * * *